(12) United States Patent
Pyun et al.

(10) Patent No.: US 11,968,289 B2
(45) Date of Patent: Apr. 23, 2024

(54) CLOCK DATA RECOVERY CIRCUIT AND DISPLAY DEVICE INCLUDING THE SAME

(71) Applicant: Samsung Display Co., Ltd., Yongin-Si (KR)

(72) Inventors: Ki Hyun Pyun, Yongin-si (KR); Min Young Park, Yongin-si (KR); Jong Min Shim, Yongin-si (KR)

(73) Assignee: Samsung Display Co., Ltd., Yongin-Si (KR)

(*) Notice: Subject to any disclaimer, the term of this patent is extended or adjusted under 35 U.S.C. 154(b) by 0 days.

(21) Appl. No.: 18/088,435

(22) Filed: Dec. 23, 2022

(65) Prior Publication Data

US 2023/0126165 A1 Apr. 27, 2023

Related U.S. Application Data

(63) Continuation of application No. 16/914,094, filed on Jun. 26, 2020, now Pat. No. 11,539,501.

(30) Foreign Application Priority Data

Sep. 19, 2019 (KR) .................. 10-2019-0115129

(51) Int. Cl.
| | |
|---|---|
| *H04L 7/033* | (2006.01) |
| *G09G 3/32* | (2016.01) |
| *H03L 7/08* | (2006.01) |
| *H03L 7/089* | (2006.01) |
| *H03L 7/095* | (2006.01) |

(Continued)

(52) U.S. Cl.
CPC .............. *H04L 7/033* (2013.01); *G09G 3/32* (2013.01); *H03L 7/0807* (2013.01); *H03L 7/0891* (2013.01); *H03L 7/095* (2013.01); *H03L 7/099* (2013.01); *H04L 7/041* (2013.01); *G09G 2300/0857* (2013.01);
(Continued)

(58) Field of Classification Search
CPC ........... H04L 7/033; H04L 7/041; G09G 3/32; G09G 2300/0857; G09G 2310/027; G09G 2310/08; H03L 7/0807; H03L 7/0891; H03L 7/095; H03L 7/099; H03K 19/21
See application file for complete search history.

(56) References Cited

U.S. PATENT DOCUMENTS 9,419,783 B1 * 8/2016 Wang .................... H03L 7/0807
9,812,090 B2 11/2017 Lim et al.
(Continued)

FOREIGN PATENT DOCUMENTS

KR 10-2016-0145901 A 12/2016

*Primary Examiner* — Kenneth B Lee, Jr.
(74) *Attorney, Agent, or Firm* — Innovation Counsel LLP

(57) ABSTRACT

A clock data recovery circuit includes the following elements: a phase detector for outputting a phase adjustment signal by comparing a clock signal of a first node and an input signal; a charge pump for adjusting a charge amount of a second node according to the phase adjustment signal; a first switch including one end coupled to the second node and including another end coupled to a third node; a second switch including one end which receives a bias voltage and including another end coupled to the third node; a capacitor including a first electrode coupled to the third node; third switches; and voltage control oscillators including control terminals coupled to the third node and including output terminals coupled to the first node through the third switches.

18 Claims, 12 Drawing Sheets

(51) Int. Cl.
*H03L 7/099* (2006.01)
*H04L 7/04* (2006.01)
H03K 19/21 (2006.01)

(52) U.S. Cl.
CPC ... *G09G 2310/027* (2013.01); *G09G 2310/08* (2013.01); *H03K 19/21* (2013.01)

(56) References Cited

U.S. PATENT DOCUMENTS

| | | |
|---|---|---|
| 11,539,501 B2 * | 12/2022 | Pyun .................. H03L 7/0891 |
| 2002/0025015 A1 | 2/2002 | Notani |
| 2005/0110589 A1 | 5/2005 | Loke et al. |
| 2009/0195336 A1 | 8/2009 | Huang |
| 2011/0292011 A1 | 12/2011 | Lee |
| 2012/0223781 A1 | 9/2012 | Chen et al. |
| 2012/0286889 A1 | 11/2012 | Park et al. |
| 2018/0019864 A1 * | 1/2018 | Tsunoda ................ H04L 7/0331 |
| 2019/0147831 A1 | 5/2019 | Lee et al. |

* cited by examiner

<CALIBRATION MODE>

<NORMAL MODE>

CLOCK DATA RECOVERY CIRCUIT AND DISPLAY DEVICE INCLUDING THE SAME

CROSS-REFERENCE TO RELATED APPLICATION

This application is a continuation application of U.S. patent application Ser. No. 16/914,094 filed on Jun. 26, 2020, which claims priority under 35 U.S.C. § 119(a) to Korean patent application 10-2019-0115129 filed on Sep. 19, 2019, in the Korean Intellectual Property Office; the entire disclosure of the Korean patent application is incorporated herein by reference.

BACKGROUND

1. Technical Field

The technical field relates to a clock data recovery circuit and a display device including the clock data recovery circuit.

2. Related Art

Display devices help users obtain information and entertainment. Modern display devices include liquid crystal display devices, organic light emitting display devices, and plasma display devices.

A display device may include a timing controller and at least one driver unit. The timing controller may supply grayscale values to the driver unit. The driver unit may supply data voltages corresponding to the grayscale values to pixels. The pixels may emit lights with luminance levels corresponding to the data voltages, so that the display device can display an image.

The timing controller may supply grayscale values and other data at various speeds. For example, a data supply speed of the timing controller may have a range of 1 Gbps to 4 Gbps, depending on embodiments and/or products. The driver unit is required to generate a clock signal to have a frequency corresponding to the data supply speed of the timing controller.

If the data supply speed of the timing controller has a wide range, it may take an undesirably long time for the driver unit to generate a clock signal having a corresponding frequency.

SUMMARY

Embodiments may be related to a clock data recovery circuit capable of rapidly generating a clock signal having an appropriate frequency, corresponding to various data supply speeds. Embodiments may be related to a display device including the clock data recovery circuit.

In accordance with an embodiment, a clock data recovery circuit may include the following elements: a phase detector configured to output a phase adjustment signal by comparing a clock signal of a first node and an input signal; a charge pump configured to adjust a charge amount of a second node according to the phase adjustment signal; a first switch including one end coupled to the second node and the other end coupled to a third node; a second switch including one end to which a bias voltage is applied and the other end coupled to the third node; a capacitor including a first electrode coupled to the third node; and voltage control oscillators including control terminals coupled to the third node and output terminals coupled to the first node through third switches.

Turn-on periods of the first switch and the second switch may not overlap with each other, and turn-on periods of the third switches may not overlap with each other.

When one of the third switches is in a turn-on state, the first switch may be in the turn-on state, and the second switch may be in a turn-off state.

When all the third switches are in the turn-off state, the first switch is in the turn-off state, and the second switch may be in the turn-on state.

The clock data recovery circuit may further include a fourth switch including one end coupled to an output terminal of a voltage control oscillator having a highest frequency band among the voltage control oscillators and the other end coupled to the first node.

When the fourth switch is in the turn-on state, the first switch may be in the turn-off state, and the second switch may be in the turn-on state.

The clock data recovery circuit may further include: a register; and a fifth switch including one end coupled to a fourth node of the phase detector and the other end coupled to the register.

When the fifth switch is in the turn-on state, the first switch may be in the turn-on state, the second switch may be in the turn-on state, and the fourth switch may be in the turn-on state.

The clock data recovery circuit may further include an oscillator controller configured to turn one of the third switches on with reference to values stored in the register, and allow the others of the third switches to maintain the turn-off state.

The clock data recovery circuit may further include: a NOR gate configured to receive a lock signal, a clock training signal, and an enable signal; and a first flip-flop configured to an output signal of the NOR gate through an input terminal thereof, receive a synchronization signal through a control terminal thereof, and output a control signal for the first switch, the second switch, the fourth switch, and the fifth switch.

The synchronization signal may be a signal different from the clock signal.

The oscillator controller may switch the level of the enable signal, when one of the third switches is turned on.

The level of the enable signal may be switched, when the level of the lock signal is switches from a lock level to an unlock level.

The oscillator controller may turn all the third switches off, when the level of the lock signal is switched from the lock level to the unlock level.

The phase detector may include: a second flip-flop configured to receive the input signal through an input terminal thereof, receive the clock signal through a control terminal thereof, and include an output terminal coupled to the fourth node; a third flip-flop including an input terminal coupled to the output terminal of the second flip-flop, the third flip-flop receiving the clock signal through a control terminal thereof; and a first XOR gate including a first input terminal coupled to the fourth node, a second input terminal coupled to an output terminal of the third flip-flop, and an output terminal outputting a portion of the phase adjustment signal.

The phase detector may further include: a fourth flip-flop configured to the input signal through an input terminal thereof, and receive an inverted signal of the clock signal through a control terminal thereof; a fifth flip-flop including an input terminal coupled to an output terminal of the fourth flip-flop, the fifth flip-flop receiving the clock signal through a control terminal thereof; and a second XOR gate including a first input terminal coupled to an output terminal of the fifth flip-flop, a second input terminal coupled to an output terminal of the fourth flip-flop, and an output terminal outputting the rest of the phase adjustment signal.

In accordance with an embodiment, a display device may include the following elements: pixels coupled to data lines; and a data driver configured to supply data voltages to the data lines, wherein the data driver includes: a clock data recovery circuit configured to receive a clock data signal through a clock data line, and generate a clock signal by using a clock training pattern in the clock data signal; a decoder configured to decode grayscale values in the clock data signal by using the clock signal; and a data voltage generator configured to convert the grayscale values into the data voltages, wherein the clock data recovery circuit includes: a phase detector configured to output a phase adjustment signal by comparing a clock signal of a first node and an input signal; a charge pump configured to adjust a charge amount of a second node according to the phase adjustment signal; a first switch including one end coupled to the second node and the other end coupled to a third node; a second switch including one end to which a bias voltage is applied and the other end coupled to the third node; a capacitor including a first electrode coupled to the third node; and voltage control oscillators including control terminals coupled to the third node and output terminals coupled to the first node through third switches.

The clock data recovery circuit may further include: a fourth switch including one end coupled to an output terminal of a voltage control oscillator having a highest frequency band among the voltage control oscillators and the other end coupled to the first node; a register; and a fifth switch including one end coupled to a fourth node of the phase detector and the other end coupled to the register.

The clock data recovery circuit may further include: an oscillator controller configured to turn one of the third switches on with reference to values stored in the register, and allow the others of the third switches to maintain a turn-off state; a NOR gate configured to receive a lock signal, a clock training signal, and an enable signal; and a first flip-flop configured to receive an output signal of the NOR gate through an input terminal thereof, receive a synchronization signal through a control terminal thereof, and output a control signal for the first switch, the second switch, the fourth switch, and the fifth switch.

The phase detector may include: a second flip-flop configured to receive the input signal through an input terminal thereof, receive the clock signal through a control terminal thereof, and include an output terminal coupled to the fourth node; a third flip-flop including an input terminal coupled to the output terminal of the second flip-flop, the third flip-flop receiving the clock signal through a control terminal thereof; a first XOR gate including a first input terminal coupled to the fourth node, a second input terminal coupled to an output terminal of the third flip-flop, and an output terminal outputting a portion of the phase adjustment signal; a fourth flip-flop configured to the input signal through an input terminal thereof, and receive an inverted signal of the clock signal through a control terminal thereof; a fifth flip-flop including an input terminal coupled to an output terminal of the fourth flip-flop, the fifth flip-flop receiving the clock signal through a control terminal thereof; and a second XOR gate including a first input terminal coupled to an output terminal of the fifth flip-flop, a second input terminal coupled to an output terminal of the fourth flip-flop, and an output terminal outputting the rest of the phase adjustment signal.

An embodiment may be related to a clock data recovery circuit. The clock data recovery circuit may include a phase detector, a charge pump, a first switch, a second switch, a capacitor, voltage control oscillators, and third switches. The phase detector may output a phase adjustment signal by comparing a clock signal of a first node and an input signal. The charge pump may adjust a charge amount of a second node according to the phase adjustment signal. A first end of the first switch may be electrically connected to the second node. A second end of the first switch may be electrically connected to a third node even when electrically disconnected from the first end of the first switch. A first end of the second switch may receive a bias voltage. A second end of the second switch may be electrically connected to the third node even when electrically disconnected from the first end of the second switch. The capacitor may include a first electrode electrically connected to the third node. The voltage control oscillators may respectively include control terminals and may respectively include output terminals. Each of the control terminals may be electrically connected to the third node. The third switches may electrically connect the output terminals, respectively, to the first node.

Turn-on periods of the first switch may not overlap turn-on periods of the second switch. Turn-on periods of a first one of the third switches may not overlap turn-on periods of a second one of the third switches.

When one of the third switches is on, the first switch may be on, and the second switch may be off.

When all the third switches are off, the first switch may be off, and the second switch may be on.

The clock data recovery circuit may include a fourth switch. A first end of the fourth switch may be electrically connected to an output terminal of a voltage control oscillator having a highest frequency band among the voltage control oscillators. A second end of the fourth switch may be electrically connected to the first node even when not electrically connected to the first end of the fourth switch.

When the fourth switch is on, the first switch may be off, and the second switch may be on.

The clock data recovery may include the following elements: a register; and a fifth switch. A first end of the fifth switch may be electrically connected to a fourth node. The forth node may be included in the phase detector. A second end of the fifth switch may be electrically to the register even when not electrically connected to the first end of the fifth switch.

When the fifth switch is on, the first switch may be off, the second switch may be on, and the fourth switch may be on.

The clock data recovery circuit may include an oscillator controller configured to turn on one of the third switches with reference to values stored in the register when allowing the others of the third switches to remain off.

The clock data recovery circuit may include the following elements: a NOR gate configured to receive a lock signal, a clock training signal, and an enable signal; and a first flip-flop. An input terminal of the first flip-flop may receive an output signal of the NOR gate. A control terminal of the first flip-flop may receive a synchronization signal. An output terminal of the first flip-flop may output a control signal for the first switch, the second switch, the fourth switch, and the fifth switch.

The synchronization signal may be different from the clock signal.

The oscillator controller may switch a level of the enable signal when one of the third switches is turned on.

The level of the enable signal may be switched when a level of the lock signal is switched from a lock level to an unlock level.

The oscillator controller may turn off all the third switches off when the level of the lock signal is switched from the lock level to the unlock level.

The phase detector may include a second flip-flop, a third flip-flop, and a first XOR gate.

An input terminal of the second flip-flop may receive the input signal. A control terminal of the second flip-flop may receive the clock signal. An output terminal of the second flip-flop may be electrically connected to the fourth node.

An input terminal of the third flip-flop may be electrically connected to the output terminal of the second flip-flop. A control terminal of the third flip-flop may receive the clock signal.

A first input terminal of the first XOR gate may be electrically connected to the fourth node. A second input terminal of the first XOR gate may be electrically connected to an output terminal of the third flip-flop. An output terminal of the first XOR gate may output a first portion of the phase adjustment signal.

The phase detector may include a fourth flip-flop, a fifth flip-flop, and a second XOR gate.

An input terminal of the fourth flip-flop may receive the input signal. A control terminal of the fourth flip-flop may receive an inverted signal of the clock signal.

An input terminal of the fifth flip-flop may be electrically connected to an output terminal of the fourth flip-flop. A control terminal of the fifth flip-flop may receive the clock signal.

A first input terminal of the second XOR gate may be electrically connected to an output terminal of the fifth flip-flop. A second input terminal of the second XOR gate may be electrically connected to the output terminal of the fourth flip-flop. An output terminal of the second XOR gate may output a second portion of the phase adjustment signal.

An embodiment may be related to a display device. The display device may include data lines, pixels electrically connected to the data lines, and a data driver for supplying data voltages to the data lines.

The data driver may include the following elements: a clock data recovery circuit configured to receive a clock data signal through a clock data line and configured to generate a clock signal using a clock training pattern in the clock data signal; a decoder configured to decode grayscale values in the clock data signal using the clock signal; and a data voltage generator configured to convert the grayscale values into the data voltages.

The clock data recovery circuit may include a phase detector, a charge pump, a first switch, a second switch, a capacitor, voltage control oscillators, and third switches. The phase detector may output a phase adjustment signal by comparing a clock signal of a first node and an input signal. The charge pump may adjust a charge amount of a second node according to the phase adjustment signal. A first end of the first switch may be electrically connected to the second node. A second end of the first switch may be electrically connected to a third node even when electrically disconnected from the first end of the first switch. A first end of the second switch may receive a bias voltage. A second end of the second switch may be electrically connected to the third node even when electrically disconnected from the first end of the second switch. The capacitor may include a first electrode electrically connected to the third node. The voltage control oscillators may respectively include control terminals and may respectively include output terminals. Each of the control terminals may be electrically connected to the third node. The third switches may electrically connect the output terminals, respectively, to the first node.

The clock data recovery circuit may include a fourth switch, a register, and a fifth switch.

A first end of the fourth switch may be electrically connected to an output terminal of a voltage control oscillator having a highest frequency band among the voltage control oscillators. A second end of the fourth switch may be electrically connected to the first node even when not electrically connected to the first end of the fourth switch.

A first end of the fifth switch may be electrically connected to a fourth node. The forth node may be included in the phase detector. A second end of the fifth switch may be electrically to the register even when not electrically connected to the first end of the fifth switch.

The clock data recovery circuit may include the following elements: an oscillator controller configured to turn on one of the third switches with reference to values stored in the register when allowing the others of the third switches to remain off; a NOR gate configured to receive a lock signal, a clock training signal, and an enable signal; and a first flip-flop. An input terminal of the first flip-flop may receive an output signal of the NOR gate. A control terminal of the first flip-flop may receive a synchronization signal. An output terminal of the first flip-flop may output a control signal for the first switch, the second switch, the fourth switch, and the fifth switch.

The phase detector may include a second flip-flop, a third flip-flop, a first XOR gate, a fourth flip-flop, a fifth flip-flop, and a second XOR gate.

An input terminal of the second flip-flop may receive the input signal. A control terminal of the second flip-flop may receive the clock signal. An output terminal of the second flip-flop may be electrically connected to the fourth node.

An input terminal of the third flip-flop may be electrically connected to the output terminal of the second flip-flop. A control terminal of the third flip-flop may receive the clock signal.

A first input terminal of the first XOR gate may be electrically connected to the fourth node. A second input terminal of the first XOR gate may be electrically connected to an output terminal of the third flip-flop. An output terminal of the first XOR gate may output a first portion of the phase adjustment signal.

An input terminal of the fourth flip-flop may receive the input signal. A control terminal of the fourth flip-flop may receive an inverted signal of the clock signal.

An input terminal of the fifth flip-flop may be electrically connected to an output terminal of the fourth flip-flop. A control terminal of the fifth flip-flop may receive the clock signal.

A first input terminal of the second XOR gate may be electrically connected to an output terminal of the fifth flip-flop. A second input terminal of the second XOR gate may be electrically connected to the output terminal of the fourth flip-flop. An output terminal of the second XOR gate may output a second portion of the phase adjustment signal.

DETAILED DESCRIPTION

Figure 1:
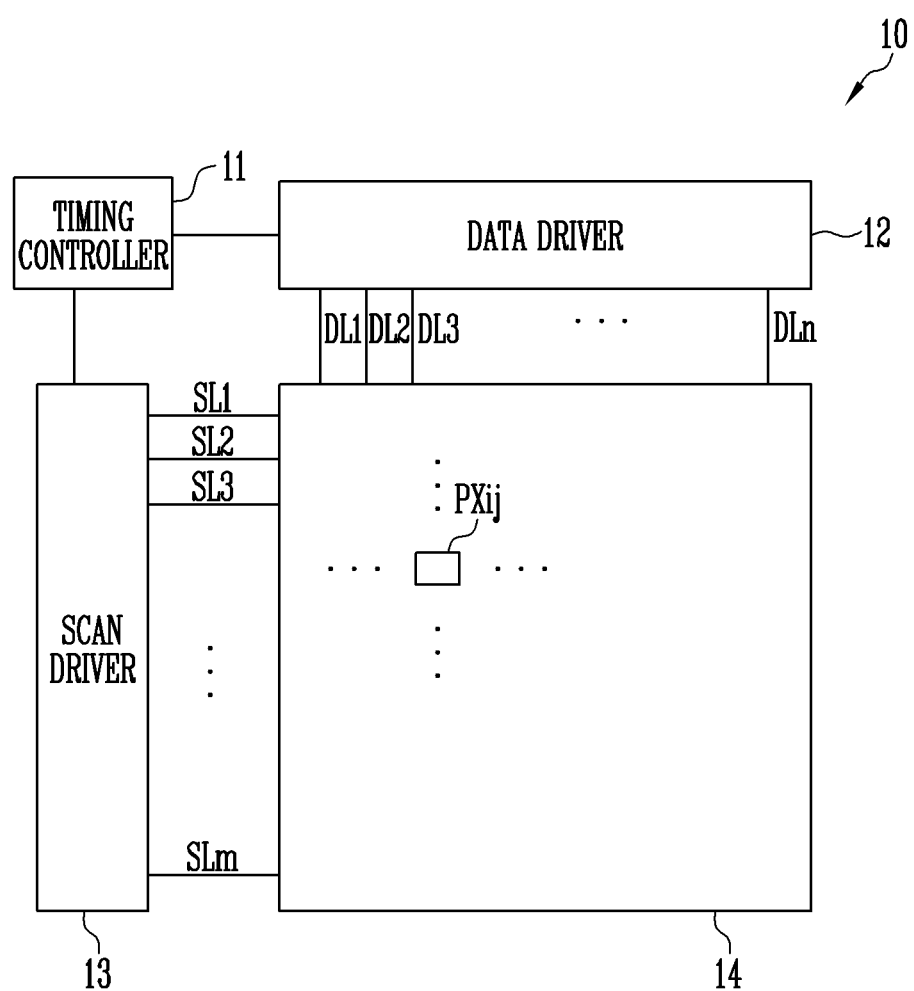
FIG. 1 is a block diagram illustrating a display device in accordance with an embodiment.

Example embodiments are described with reference to the accompanying drawings. Practical embodiments may be implemented in various forms and are not limited to the example embodiments.

Same or similar elements may be designated by the same reference numerals.

Dimensions of components illustrated in the drawings may be exaggerated for clear expression and description.

Each of the term "connect" and the term "couple" may mean "electrically connect." The term "insulate" may mean "electrically insulate" or "electrically isolate." The term "the other" may mean "another." A signal may mean an instance of the signal; for example, a clock signal may mean an instance of the clock signal, such that a first element may receive a first instance of the clock signal and that a second element may receive a second instance of the clock signal.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

FIG. 1 is a diagram illustrating a display device 10 in accordance with an embodiment.

Referring to FIG. 1, the display device 10 may include a timing controller 11, a data driver 12, a scan driver 13, and a pixel unit 14.

The timing controller 11 may receive grayscale values and control signals with respect to respective frames from an external device. The timing controller 11 may render the grayscale values to correspond to specifications of the display device 10. For example, the external device may provide a red grayscale value, a green grayscale value, and a blue grayscale value with respect to respective unit dots. When the pixel unit 14 has a PenTile™ structure, adjacent unit dots share a pixel, and therefore, pixels may not correspond one-to-one to the respective grayscale values. Accordingly, it is necessary to render the grayscale values.

When the pixels correspond one-to-one to the respective grayscale values, it may be unnecessary to render the grayscale values. Grayscale values that are rendered or are not rendered may be provided to the data driver 12. The timing controller 11 may provide the data driver 12, the scan driver 13, and the like with control signals suitable for their specifications so as to achieve frame display.

The data driver 12 may generate data voltages to be provided to data lines DL1, DL2, DL3, . . . , and DLn using grayscale values and control signals. For example, the data driver 12 may sample the grayscale values using a clock signal, and apply, in units of pixel rows, data voltages corresponding to the grayscale values to the data lines DL1, DL2, DL3, . . . , and DLn. Here, n may be an integer greater than 0.

The scan driver 13 may generate scan signals to be provided to scan lines SL1, SL2, SL3, . . . , and SLm using a clock signal, a scan start signal, and the like received from the timing controller 11. Here, m may be an integer greater than 0.

The scan driver 13 may sequentially supply scan signals having a pulse of a turn-on level to the scan lines SL1 to SLm. The scan driver 13 may include scan stages configured in the form of shift registers. The scan driver 13 may generate scan signals in a manner that sequentially transfers the scan start signal in the form of a pulse of a turn-on level to a next scan stage under the control of the clock signal.

The pixel unit 14 includes pixels. Each pixel PXij may be coupled to a corresponding data line and a corresponding scan line. Here, i and j may be integers greater than 0. The pixel PXij may mean a pixel coupled to an ith scan line and a jth data line.

Figure 2:
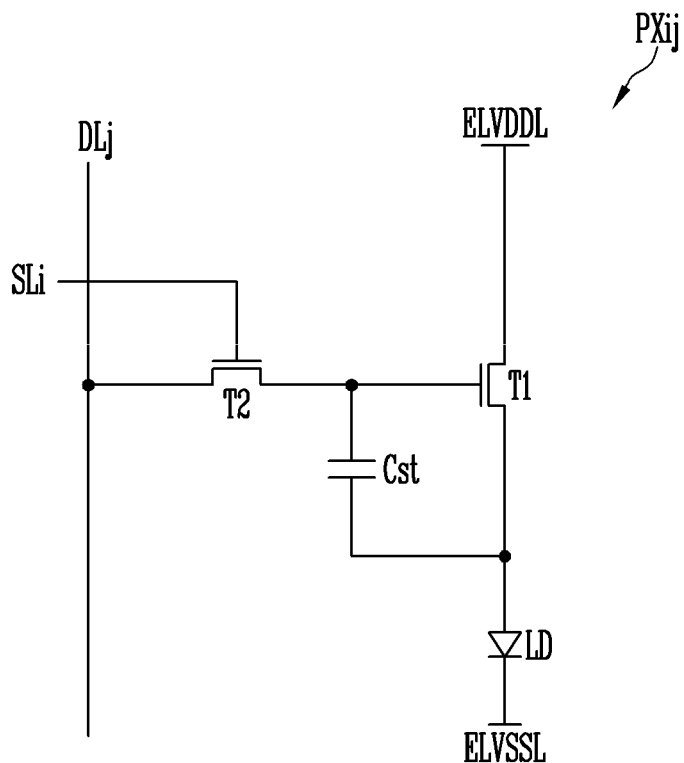
FIG. 2 is a circuit diagram illustrating a pixel in accordance with an embodiment.

FIG. 2 is a diagram illustrating a pixel PXij in accordance with an embodiment.

Referring to FIG. 2, the pixel PXij may include transistors T1 and T2, a storage capacitor Cst, and a light emitting diode LD.

A circuit implemented with an N-type transistor is described as an example. Those skilled in the art may design a circuit implemented with a P-type transistor by changing the polarity of a voltage applied to a gate terminal. Those skilled in the art may design a circuit implemented with a combination of the P-type transistor and the N-type transistor. The P-type transistor refers to a transistor in which an amount of current flowing in a negative direction increases when the difference in voltage between a gate electrode and a source electrode increases. The N-type transistor refers to a transistor in which an amount of current flowing in a positive direction increases when the difference in voltage between a gate electrode and a source electrode increases. The transistor may be configured in one or more of various forms including a Thin Film Transistor (TFT), a Field Effect Transistor (FET), a Bipolar Junction Transistor (BJT), and the like.

A gate electrode of a first transistor T1 may be coupled to a first electrode of the storage capacitor Cst, a first electrode of the first transistor T1 may be coupled to a first power line ELVDDL, and a second electrode of the first transistor T1 may be coupled to a second electrode of the storage capacitor Cst. The first transistor T1 may be referred to as a driving transistor.

A gate electrode of a second transistor T2 may be coupled to an ith scan line SLi, a first electrode of the second transistor T2 may be coupled to a jth data line DLj, and a second electrode of the second transistor T2 may be coupled to the gate electrode of the first transistor T1. The second transistor T2 may be referred to as a scan transistor.

An anode of the light emitting diode LD may be coupled to the second electrode of the first transistor T1, and a cathode of the light emitting diode LD may be coupled to a second power line ELVSSL. The light emitting diode LD may be configured as an organic light emitting diode, an inorganic light emitting diode, a quantum dot light emitting diode, etc.

A first power voltage may be applied to the first power line ELVDDL, and a second power voltage may be applied to the second power line ELVSSL. For example, the first power voltage may be higher than the second power voltage.

When a scan signal of a turn-on level (here, a high level) is applied through the scan line SLi, the second transistor T2 is in a turn-on state. A data voltage applied to the data line DLj is stored in the first electrode of the storage capacitor Cst.

A positive driving current corresponding to a difference in voltage between the first electrode and the second electrode of the storage capacitor Cst flows between the first electrode and the second electrode of the first transistor T1. Accordingly, the light emitting diode LD emits light with a luminance corresponding to the data voltage.

Next, when a scan signal of a turn-off level (here, a low level) is applied through the scan line SLi, the second transistor T2 is turned off, and the data line DLj and the first electrode of the storage capacitor Cst are electrically separated from each other. Thus, although the data voltage of the data line DLj is changed, the voltage stored in the first electrode of the storage capacitor Cst is not changed.

Embodiments may be applied to not only the pixel PXij shown in FIG. 2 but also other pixels of the pixel unit 14.

Figure 3:
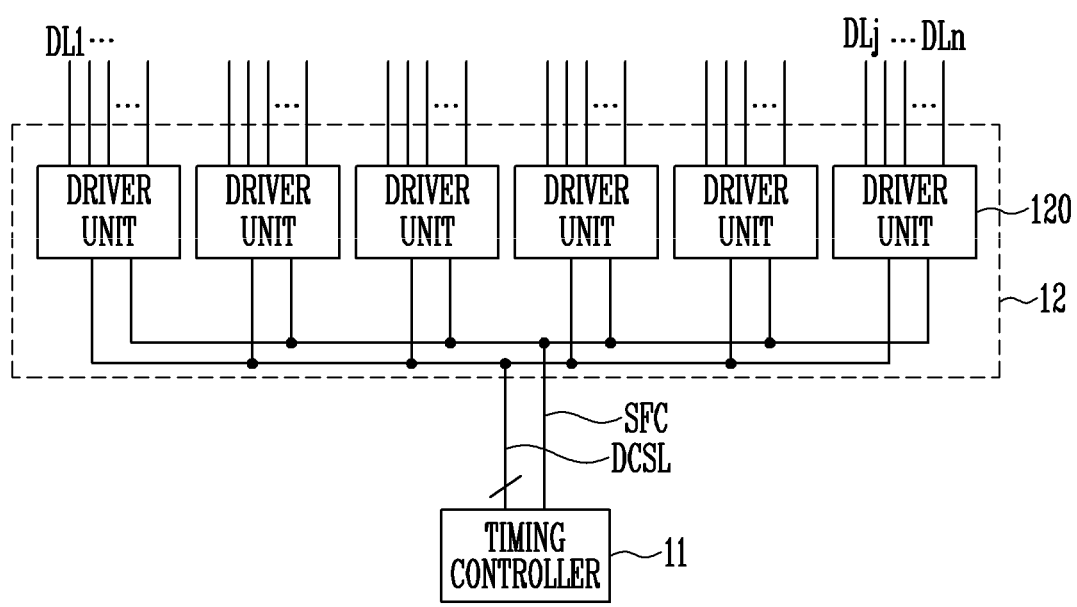
FIG. 3 is a block diagram illustrating a data driver in accordance with an embodiment.

FIG. 3 is a diagram illustrating a data driver 12 in accordance with an embodiment.

Referring to FIG. 3, the data driver 12 may include one or more driver units 120. When the display device 10 includes only one driver unit 120, the driver unit 120 and the data driver 12 may be the same, and all the data lines DL1 to DLn may be coupled to the one driver unit 120. When the display device 10 includes a plurality of driver units 120, the data lines DL1 to DLn may be grouped in data line groups, and each data line group may be coupled to a corresponding driver unit 120.

The driver unit 120 may use one clock training line SFC as a common bus line. For example, the timing controller 11 may simultaneously transfer a signal notifying that a clock training pattern is to be supplied to all the driver units 120 through the one clock training line SFC.

The driver unit(s) 120 may be coupled to the timing controller 11 through a dedicated clock data line DCSL. When the display device 10 includes a plurality of driver units 120, the driver units 120 may be coupled to the timing controller 11 through respective clock data lines DCSL.

At least one clock data line DCSL may be provided to the driver unit(s) 120. For example, when it is difficult to achieve a desired bandwidth of a transmission signal using only one clock data line DCSL, a plurality of clock data lines DCSL may be coupled to each driver unit 120 so as to achieve the desired bandwidth of the transmission signal. Even when the clock data line DCSL is configured as a differential signal line so as to remove common mode noise, each driver unit 120 may require a plurality of clock data lines DCSL.

Figure 4:
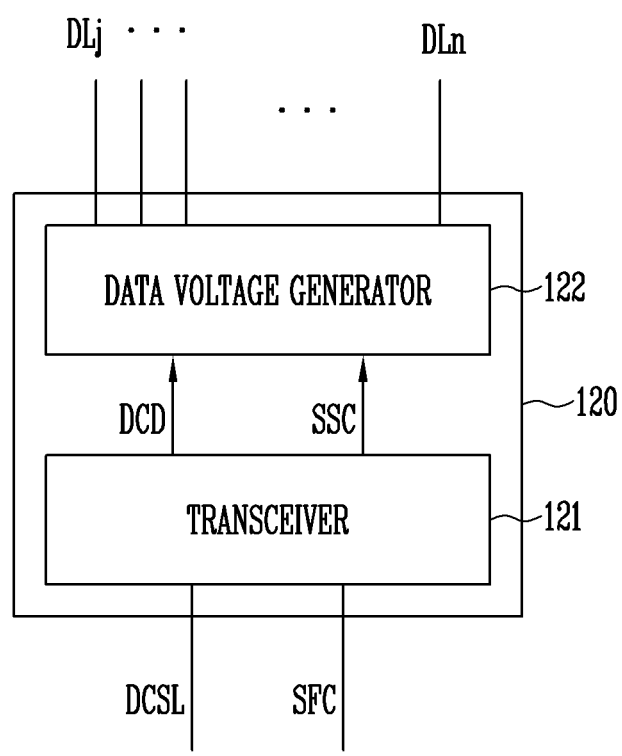
FIG. 4 is a block diagram illustrating a driver unit in accordance with an embodiment.

FIG. 4 is a diagram illustrating a driver unit 120 in accordance with an embodiment.

Referring to FIG. 4, the driver unit 120 may include a transceiver 121 and a data voltage generator 122.

The transceiver 121 may receive a clock data signal from the timing controller 11 through a clock data line DCSL. The transceiver 121 may receive a clock training signal from the timing controller 11 through a clock training line SFC.

The transceiver 121 may generate a clock signal using the clock training signal and the clock data signal, and may sample a data signal DCD from the clock data signal using the generated clock signal. The transceiver 121 may provide the sampled data signal DCD to the data voltage generator 122. The transceiver 121 may also provide a source shift clock SSC to the data voltage generator 122.

The data voltage generator 122 may receive a data signal DCD and a source shift clock SSC from the transceiver 121. The data voltage generator 122 may generate data voltages using the source shift clock SSC and the data signal DCD.

The data voltage generator 122 may be synchronized with a period in which a scan signal of a turn-on level is applied to a scan line, to apply data voltages corresponding to grayscale values of pixels coupled to the corresponding scan line to the data lines DL1 to DLn. For example, when a scan signal of a turn-on level is applied to the scan line SLi, the data voltage generator 122 may apply a data voltage corresponding to a grayscale value of the pixel PXij to the data line DLj.

Figure 5:
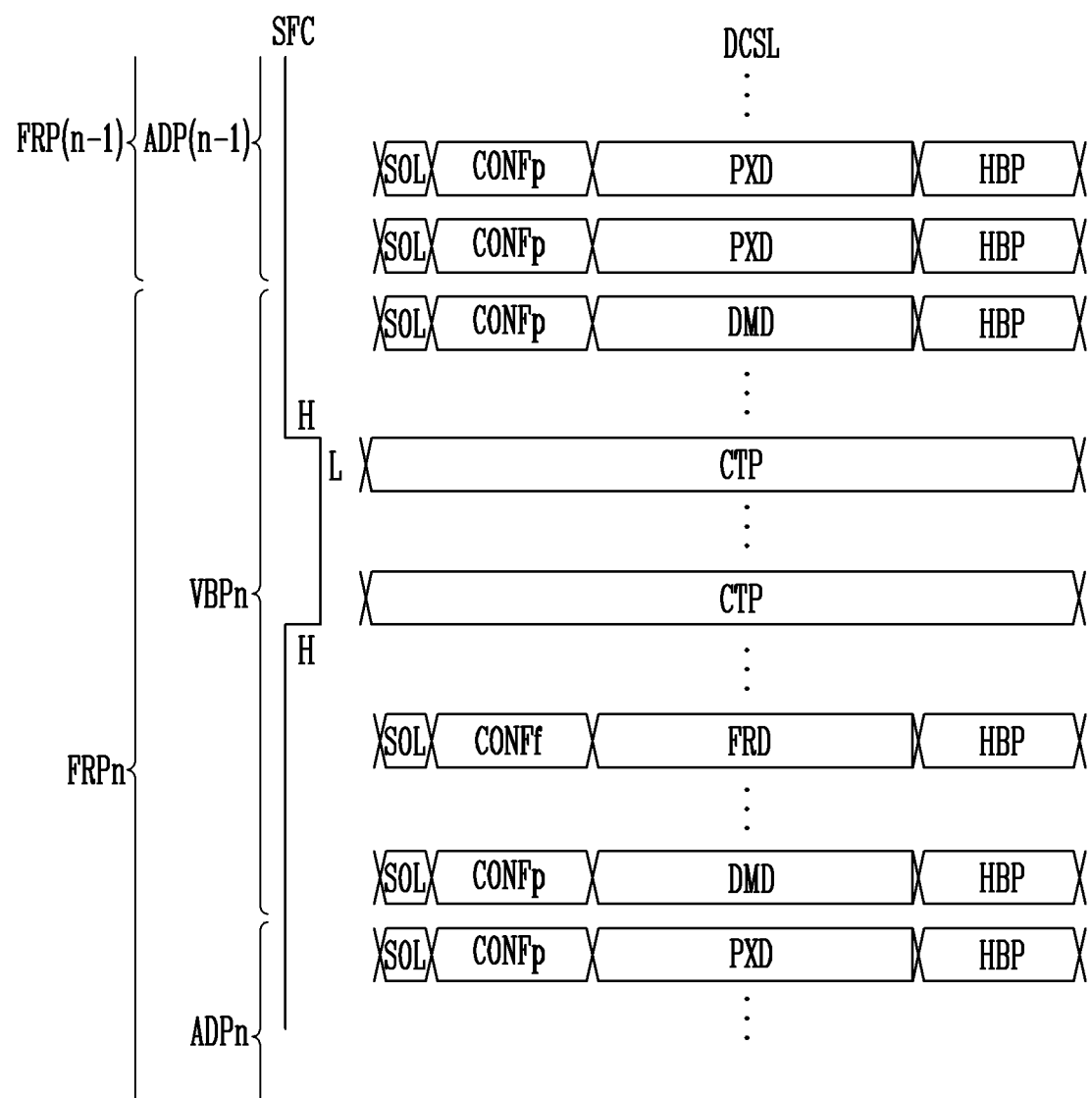
FIG. 5, FIG. 6, and FIG. 7 are diagrams illustrating examples of signals provided from a timing controller in accordance with an embodiment.
Figure 6:
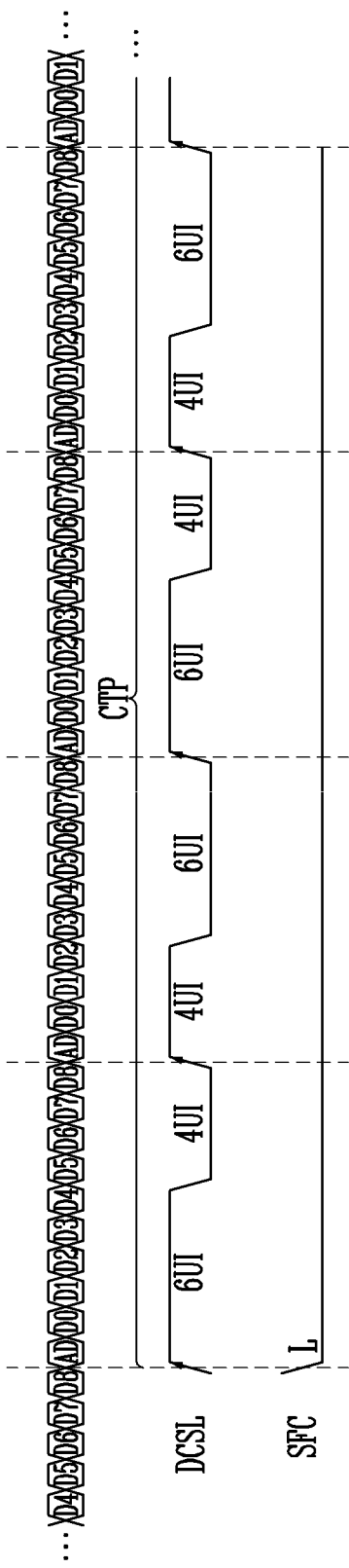
Figure 7:
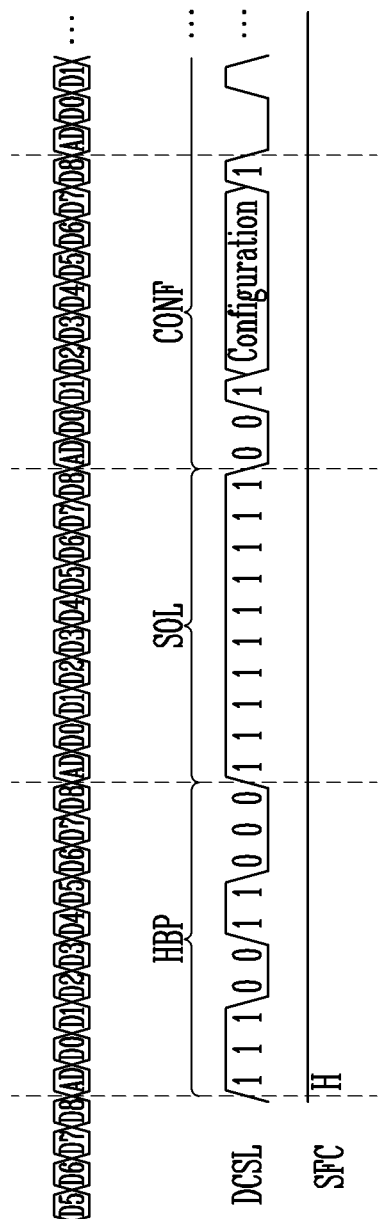

FIGS. 5 to 7 are diagrams illustrating examples of signals provided from the timing controller.

Referring to FIG. 5, a frame period for each image frame may include a vertical blank period and an active data period. For example, an nth frame period FRPn may include an nth vertical blank period VBPn and an nth active data period ADPn.

Active data periods ADP (n-1) and ADPn may correspond to a supply period of grayscale values constituting an image frame to be displayed by the pixel unit 14. The grayscale values may be included in pixel data PXD.

The vertical blank period VBPn may be located between the active data period ADP (n-1) of a previous frame and the active data period ADPn of a current frame. Clock training, frame setting, and dummy data supply may be performed during the vertical blank period VBPn. The vertical blank period VBPn may sequentially include a supply period of dummy data DMD, a supply period of a clock training pattern CTP, a supply period of frame data FRD, and a supply period of dummy data DMD.

The timing controller 11 applies a clock training signal of a logic low level L to a clock training line SFC during the vertical blank period VBPn, to notify the data driver 12 that a clock training pattern CTP is being supplied to a clock data line DCSL. When the clock training pattern CTP is not supplied, the timing controller 11 may apply a clock training signal of a high logic level H to the clock training line SPC.

Referring to FIG. 6, an example clock training pattern CTP is illustrated. For example, in the clock training pattern CTP, 10 bits AD, D0, D1, D2, D3, D4, D5, D6, D7, and D8 may constitute unit data. A period in which a unit bit is supplied to the clock data line DCSL may be referred to as one unit interval (1 UI). A period in which unit data is supplied to the clock data line DCSL may be referred to as one period. As for each unit data, a ratio of a high level to a low level repeats 6:4 and 4:6. The clock training pattern CTP may be differently set depending on embodiments and/or products.

Referring to FIG. 7, example data control signals HBP, SOL, and CONF are illustrated. For example, in each of the data control signals HBP, SOL, and CONF, 10 bits AD, D0, D1, D2, D3, D4, D5, D6, D7, and D8 may constitute unit data. Each unit data includes a transition bit AD. Although the transition bit AD may be differently set depending on embodiments and/or products, the transition bit AD may be set to have a level different from that of an immediately previous bit. In some embodiments and/or products, the transition bit AD may be set to have a level different from a next bit.

A horizontal blank period signal HBP may notify the driver unit 120 that a pixel row (e.g., pixels coupled to the same scan line) corresponding to pixel data PXD is changed. In an embodiment, the horizontal blank period signal HBP is configured as 1110011000, but may vary depending on embodiments and/or products.

A start of line SOL may notify the driver unit 120 that the supply of a signal of the changed pixel row is started. In an embodiment, a unit data column of the start of line SOL is configured as 1111111111, but may vary depending on embodiments and/or products.

A configuration signal CONF may include an operation option of the driver unit 120. For example, a configuration signal CONFp may indicate that subsequent data is pixel data PXD or dummy data DMD. For example, a configuration signal CONFf may indicate that subsequent data is frame data FRD.

Although not shown in the drawings, the pixel data PXD may express a grayscale value of a pixel to which the other bits D0, D1, D2, D3, D4, D5, D6, D7, and D8 except the transition bit AD of the unit data correspond. The configuration of the pixel data PXD may vary depending on embodiments and/or products.

Figure 8:
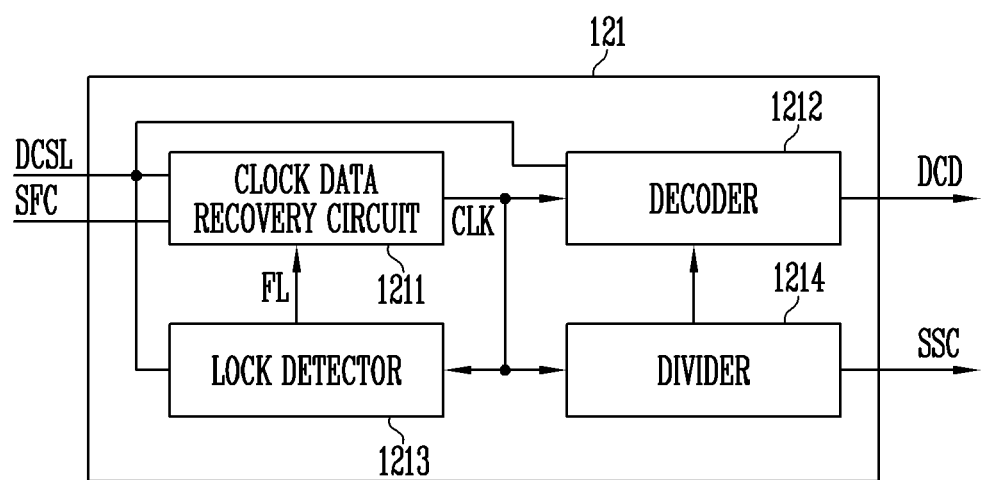
FIG. 8 is a block diagram illustrating a transceiver in accordance with an embodiment.

FIG. 8 is a diagram illustrating a transceiver 121 in accordance with an embodiment.

Referring to FIG. 8, the transceiver 121 may include a clock data recovery circuit 1211, a decoder 1212, a lock detector 1213, and a divider 1214.

The clock data recovery circuit 1211 may receive a clock data signal through a clock data line DCSL, and may generate a clock signal CLK using a clock training pattern CTP in the clock data signal. The clock data recovery circuit 1211 may receive a clock training signal through a clock training line SFC. The clock data recovery circuit 1211 may receive a lock signal FL.

The decoder 1212 may decode grayscale values and other data in the clock data signal using the clock signal CLK. For example, the decoder 1212 may sample a data signal DCD from the clock data signal using the clock signal CLK.

The lock detector 1213 may output the lock signal FL representing whether the clock signal CLK has been locked by comparing the clock signal CLK and the clock data signal. When the lock of the clock signal CLK succeeds, the lock signal FL may have a lock level. When the lock of the clock signal CLK fails, the lock signal FL may have an unlock level.

The divider 1214 may generate a source shift clock SSC having a shifted frequency using the clock signal CLK.

Figure 9:
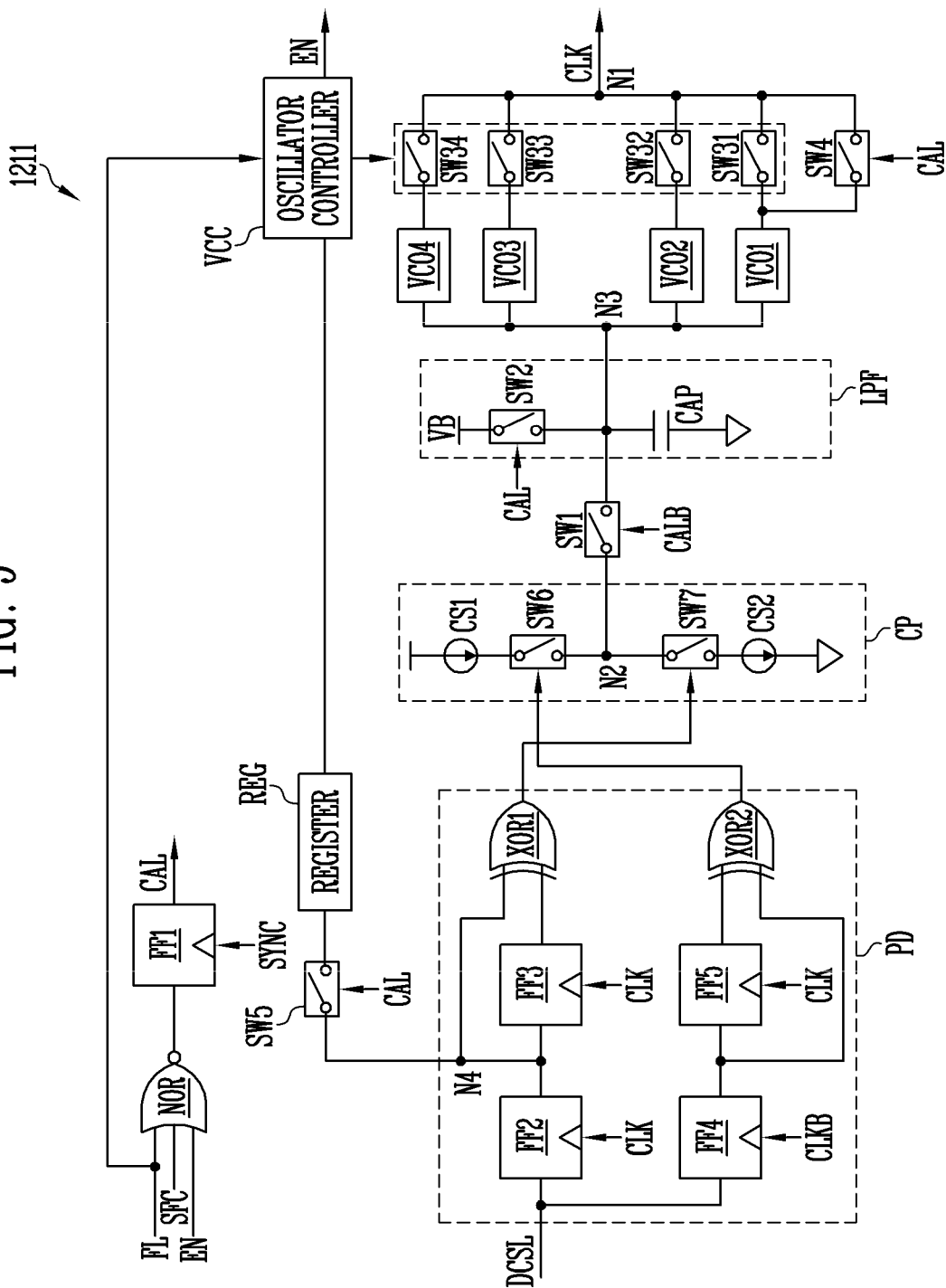
FIG. 9 is a circuit diagram illustrating a clock data recovery circuit in accordance with an embodiment.
Figure 10:
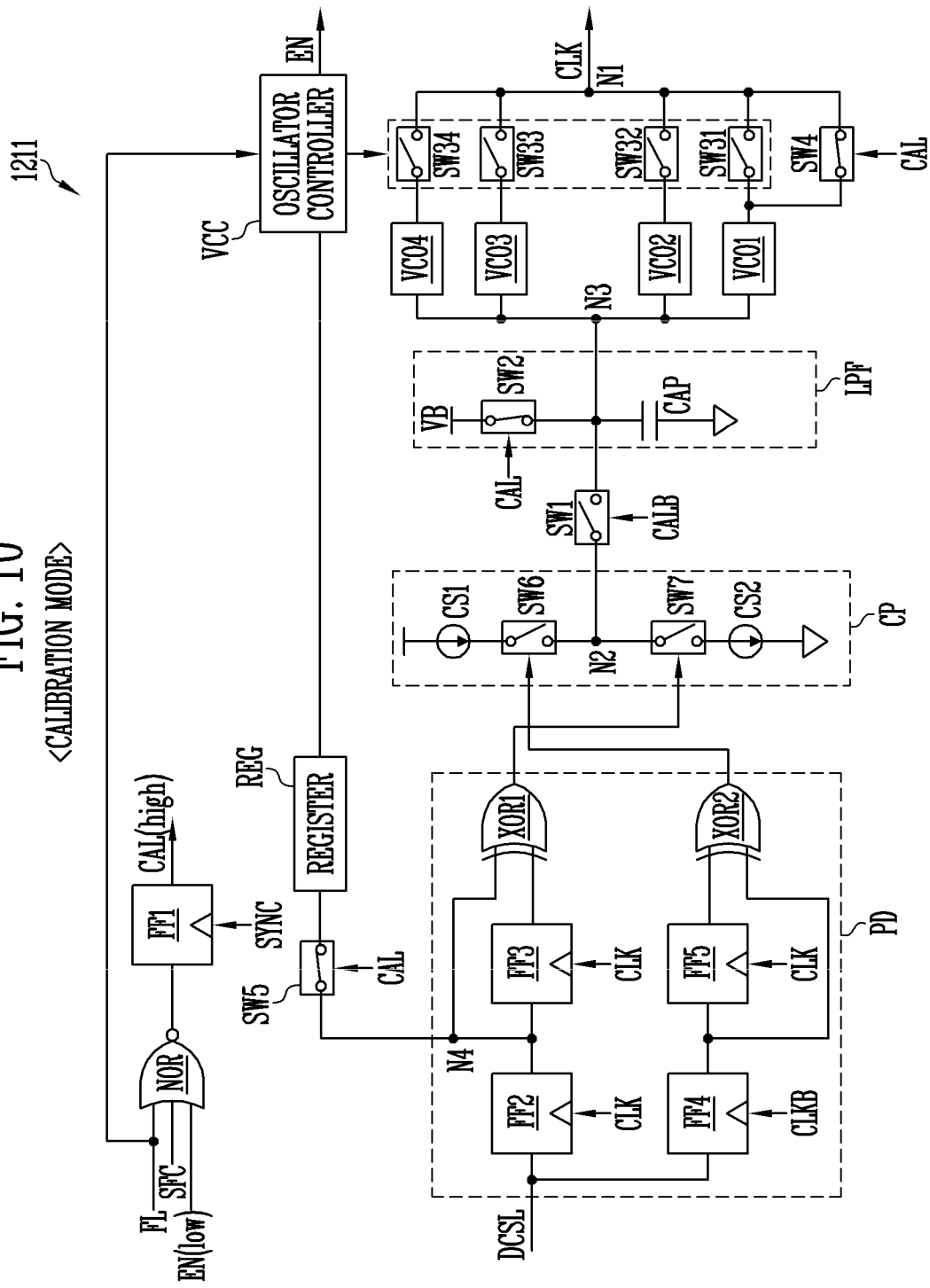
FIG. 10, FIG. 11, FIG. 12, FIG. 13, and FIG. 14 are diagrams illustrating operation of the clock data recovery circuit shown in FIG. 9 in a calibration mode in accordance with an embodiment.

FIG. 9 is a diagram illustrating a clock data recovery circuit 1211 in accordance with an embodiment.

Referring to FIG. 9, the clock data recovery circuit 1211 may include the following elements: a phase detector PD; a charge pump CP; a loop filter LPF; voltage control oscillators VCO1, VCO2, VCO3, and VCO4; third switches SW31, SW32, SW33, and SW34; a fourth switch SW4; a fifth switch SW5; a register REG; an oscillator controller VCC; a NOR gate NOR; and a first flip-flop FF1.

Flip-flops FF1, FF2, FF3, FF4, and FF5 included in the clock data recovery circuit 1211 may be D flip-flops or another kind of flip-flop.

The phase detector PD may output a phase adjustment signal by comparing a clock signal CLK of the first node N1 and an input signal. The input signal may be a clock data signal input through a clock data line DCSL. The phase adjustment signal may include an up signal and a down signal. For example, a portion (or a first portion) of the phase adjustment signal may be a down/on/off signal for turning on/off a seventh switch SW7. The rest (or a second portion) of the phase adjustment signal may be an up/on/off signal for turning on/off a sixth switch SW6.

The phase detector PD may include a second flip-flop FF2, a third flip-flop FF3, a fourth flip-flop FF4, a fifth flip-flop FF5, a first XOR gate XOR1, and a second XOR gate XOR2.

The second flip-flop FF2 may receive an input signal through an input terminal thereof, may receive the clock signal CLK through a control terminal thereof, and may include an output terminal coupled to the fourth node N4. The third flip-flop FF3 may have an input terminal coupled to the output terminal of the second flip-flip FF2, and may receive the clock signal CLK through a control terminal thereof. The first XOR gate XOR1 may include a first input terminal coupled to the fourth node N4, a second input terminal coupled to an output terminal of the third flip-flop FF3, and an output terminal outputting the portion of the phase adjustment signal. The first XOR gate XOR1 may output a down signal of a high logic level when signals of different logic level are applied to the first input terminal and the second input terminal. In other conditions, the first XOR gate XOR1 may output a signal of a low logic level.

The fourth flip-flop FF4 may receive an input signal through an input terminal thereof, and may receive an inverted signal CLKB of the clock signal CLK through a control terminal thereof. The inverted signal CLKB has a logic level (high or low) different from a logic level of the clock signal CLK (low or high). The fifth flip-flop may include an input terminal coupled to an output terminal of the fourth flip-flop FF4, and may receive the clock signal CLK through a control terminal thereof. The second XOR gate XOR2 may include a first input terminal coupled to an output terminal of the fifth flip-flop FF5, a second input terminal coupled to the output terminal of the fourth flip-flop FF4, and an output terminal outputting the rest of the phase adjustment signal. The second XOR gate XOR2 may output an up signal of a high logic level, when signals of different logic levels are applied to the first input terminal and the second input terminal. In other conditions, the second XOR gate XOR2 may output a signal of a low logic level.

The charge pump CP may adjust a charge amount of a second node N2 according to the phase adjustment signal. For example, the charge pump CP may include a first current source CS1, the sixth switch SW6, the seventh switch SW7, and a second current source CS2.

One end of the sixth switch SW6 may be coupled to the first current source CS1, and the other end of the sixth switch SW6 may be coupled to the second node N2. When the sixth switch SW6 is turned on, the first current source CS1 may increase the charge amount of the second node N2.

One end of the seventh switch SW7 may be coupled to the second node N2, and the other end of the seventh switch SW7 may be couple to the second current source CS2. When the seventh switch SW7 is turned on, the second current source CS2 may decrease the charge amount of the second node N2.

One end of a first switch SW1 may be coupled to the second node N2, and the other end of the first switch SW1 may be coupled to a third node N3. The first switch SW1 may be controlled according to an inverted signal CALB of a calibration signal CAL. The inverted signal CALB has a logic level (high or low) different from a logic level of the calibration signal CAL (low or high).

The loop filter LPF may generate a control voltage of the voltage control oscillators VCO1, VCO2, VCO3, and VCO4 at a first electrode of a capacitor CAP, which is electrically connected to the third node N3. The control voltage may correspond to the charge amount controlled by the charge pump CP.

The loop filter LPF may include a second switch SW2 and the capacitor CAP. The second switch SW2 may include one end to which a bias voltage VB is applied, and the other end coupled to the third node N3. The second switch SW2 may be controlled according to the calibration signal CAL. The first electrode of the capacitor CAP may be coupled to the third node N3. A second electrode of the capacitor CAP may be coupled to a reference node (e.g., a ground terminal). The bias voltage VB may be a maximum voltage among control voltages that the voltage control oscillators VCO1, VCO2, . . . , and VCOk (e.g., VCO4) may accept. The voltage control oscillators VOC1, VOC2, VOC3, and VOC4 may generate the clock signal CLK having a higher frequency as the control voltage becomes higher.

The voltage control oscillators VOC1, VOC2, VOC3, and VOC4 may include control terminals each coupled to the third node N3 and may include output terminals coupled to the first node N1 through the third switches SW31, SW32, SW33, and SW34, respectively. The third switches SW31, SW32, SW33, and SW34 may be controlled by the oscillator controller VCC.

The voltage control oscillators VCO1, VCO2, VCO3, and VCO4 may have different frequency bands. For example, a first voltage control oscillator VCO1 may have a highest frequency band. A second voltage control oscillator VCO2 may have a frequency band that is lower than that of the first voltage control oscillator VCO1 and is higher than that of a third voltage control oscillator VCO3. The third voltage control oscillator VCO3 may have a frequency band that is lower than that of the second voltage control oscillator VCO2 and is higher than that of a fourth voltage control oscillator VCO4. The fourth voltage control oscillator VCO4 may have a lowest frequency band.

In an embodiment, the frequency bands of the voltage control oscillators VCO1, VCO2, VCO3, and VCO4 may not overlap with each other. For example, the first voltage control oscillator VCO1 may have a frequency band exceeding 3 GHz and being 4 GHz or less. The second voltage control oscillator VCO2 may have a frequency band exceeding 2 GHz and being 3 GHz or less. The third voltage control oscillator VCO3 may have a frequency band exceeding 1 GHz and being 2 GHz or less. The fourth voltage control oscillator VCO4 may have a frequency band exceeding 0 GHz and being 1 GHz or less.

In an embodiment, the frequency bands of the voltage control oscillators VCO1, VCO2, VCO3, and VCO4 may partially overlap with each other. For example, the first voltage control oscillator VCO1 may have a frequency band of 2.9 GHz or more and 4 GHz or less. The second voltage control oscillator VCO2 may have a frequency band of 1.9 GHz or more and 3 GHz or less. The third voltage control oscillator VCO3 may have a frequency band of 0.9 GHz or more and 2 GHz or less. The fourth voltage control oscillator VCO4 may have a frequency band of 0 GHz or more and 1 GHz or less.

The total number of the voltage control oscillators may be set depending on specifications of the voltage control oscillators. In an embodiment, the clock data recovery circuit 1211 includes fourth voltage control oscillators VCO1, VCO2, VCO3, and VCO4.

One end of the fourth switch SW4 may be coupled to an output terminal of the first voltage control oscillator VCO1 (having the highest frequency band among the voltage control oscillators VCO1, VCO2, VCO3, and VCO4), and the other end of the fourth switch SW4 may be coupled to the first node N1. The fourth switch SW4 may be controlled according to the calibration signal CAL.

One end of the fifth switch SW5 may be coupled to the fourth node N4 (included in the phase detector PD), and the other end of the fifth switch SW5 may be coupled to the register REG. The fifth switch SW5 may be controlled according to the calibration signal CAL.

The register REG may receive a sampling signal from the fourth node N4 when the fifth switch SW5 is in a turn-on state. A minimum capacity of the register REG may be set according to a worst pattern of the clock training pattern CTP, a lowest data supply speed of the timing controller 11, and a highest frequency of the first control oscillator VCO1. For example, referring to FIG. 11, the worst pattern of the clock training pattern CTP is a case where a low level signal (or high level signal) of 6 UI and a high level signal (or low level signal) of 6 UI are consecutively applied to the clock data line DCSL. For example, the lowest data supply speed of the timing controller 11 may be 1 Gbps. For example, the highest frequency of the first voltage control oscillator VCO1 may be 4 GHz. Therefore, the register REG may require a storage space of at least 50 UI so as to recognize the clock training pattern CTP. For example, a storage space of 24 UI may be required to recognize the low level signal (or high level signal) of 6 UI, a storage space of 24 UI may be required to recognize the high level signal (or low level signal) of 6 UI, and a storage space of 2 UI may be further required as before and/or after margins.

The oscillator controller VCC may turn on one of the third switches SW31, SW32, SW33, and SW34 when allowing the others of the third switches SW31, SW32, SW33, and SW34 to remain in a turn-off state, with reference to values stored in the register REG.

When one of the third switches SW31, SW32, SW33, and SW34 is turned on, the oscillator controller VCC may switch the level of an enable signal EN to a high logic level.

When the level of a lock signal FL is switched from a lock level to an unlock level, the oscillator controller VCC may turn off all the third switches SW31, SW32, SW33, and SW34. Thus, a case where any one of the third switches SW31, SW32, SW33, and SW34 and the fourth switch SW are simultaneously coupled to the first node N1 in a subsequent calibration mode can be prevented.

The NOR gate NOR may receive the lock signal FL, the clock training signal, and the enable signal EN. The NOR gate NOR may provide an output signal of a high logic level when the lock signal FL, the clock training signal, and the enable signal EN all have a low logic level. In other conditions, the NOR gate NOR may provide an output signal of a low logic level.

The level of the enable signal EN may be switched when the level of the lock signal FL is switched from the lock level to the unlock level. For example, the level of the enable signal EN may be switched to a low logic level when the level of the lock signal FL is switched from the lock level to the unlock level.

For example, the lock signal FL may have a high logic level when the lock signal FL is in a lock state, and may have a low logic level when the lock signal FL is in an unlock state.

The first flip-flop FF1 may receive the output signal of the NOR gate NOR through an input terminal thereof, may receive a synchronization signal SYNC through a control terminal thereof, and may output a control signal for the first switch SW1, the second switch SW2, the fourth switch SW4, and the fifth switch SW5. The control signal may be the calibration signal CAL. The synchronization signal SYNC may be different from the clock signal CLK. For example, the synchronization signal SYNC may be a horizontal synchronization signal. A period of the horizontal synchronization signal may be equal to that of a horizontal blank period signal HBP.

FIGS. 10 to 14 are diagrams illustrating operation of the clock data recovery circuit shown in FIG. 9 in a calibration mode in accordance with an embodiment.

The clock data recovery circuit 1211 may operate in a calibration mode or a normal mode. In the calibration mode, the calibration signal CAL may have a high logic level. In the normal mode, the calibration signal CAL may have a low logic level.

For example, when the display device 10 is powered on, the lock signal FL, the clock training signal, and the enable signal EN may all have a low logic level. Accordingly, the NOR gate NOR may output a high logic level.

The oscillator controller VCC may turn off all the third switches SW31, SW32, SW33, and SW34.

The first flip-flop FF1 may output the calibration signal CAL in synchronization with supply timing of the synchronization signal SYNC. The calibration signal CAL may have a high logic level, and the inverted signal CALB of the calibration signal CAL may have a low logic level.

When the calibration signal CAL of the high logic level is output, the second switch SW2, the fourth switch SW4, and the fifth switch SW5 may be turned on. The first switch SW1 may be turned off by the inverted signal CALB of the calibration signal CAL. Accordingly, the second node N2 and the third node N3 are electrically disconnected from each other, and the third node N3 is not influenced by operations of the phase detector PD and the charge pump CP (see FIG. 10).

Accordingly, the bias voltage VB is applied to the third node N3, and a clock signal CLK corresponding to the highest frequency of the first voltage control oscillator VCO1 is output to the first node N1. For example, the clock signal CLK may have 4 GHz.

Accordingly, the second flip-flop FF2 may generate a sampling signal by sampling the clock training pattern CTP of the clock data line DCSL according to the clock signal CLK. The generated sampling signal may be stored in the register REG.

The oscillator controller VCC may turn on a third switch coupled to a voltage control oscillator having a frequency band corresponding to a data supply speed of the timing controller 11, with reference to the values stored in the register REG. The oscillator controller VCC may allow the others of the third switches SW31, SW32, SW33, and SW34 to remain in the turn-off state.

Figure 11:
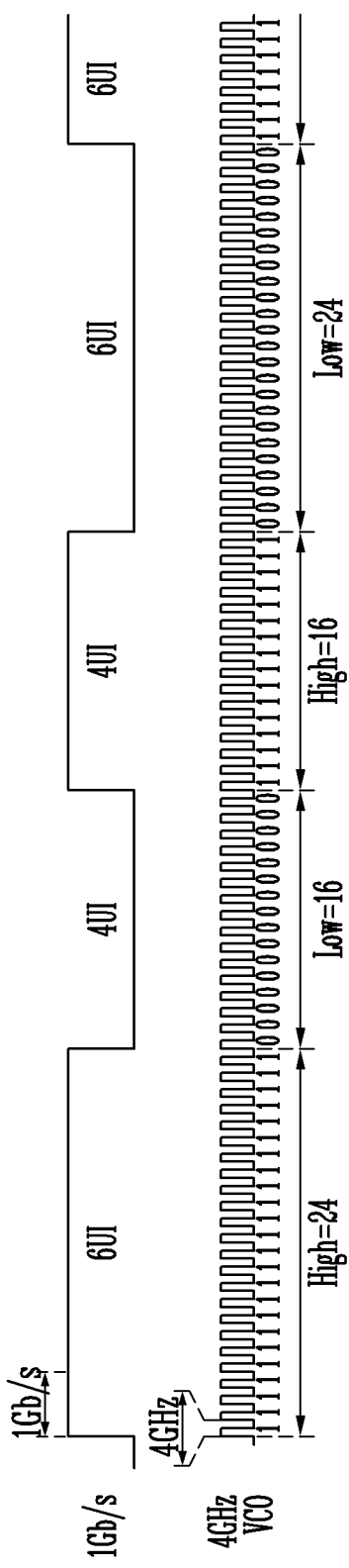

For example, referring to FIG. 11, the timing controller 11 may supply the clock training pattern CTP at 1 Gbps. The sampling signal repeats a high logic level of 24 UI, a low logic level of 16 UI, a high logic level of 16 UI, and a low logic level of 24 UI. The oscillator controller VCC may recognize that the data supply speed of the timing controller 11 corresponds to 1 Gbps, with reference to the values stored in the register REG, and turn on the third switch SW34 coupled to the fourth voltage control oscillator VCO4 having a frequency band exceeding 0 GHz and being 1 GHz or less.

Figure 12:
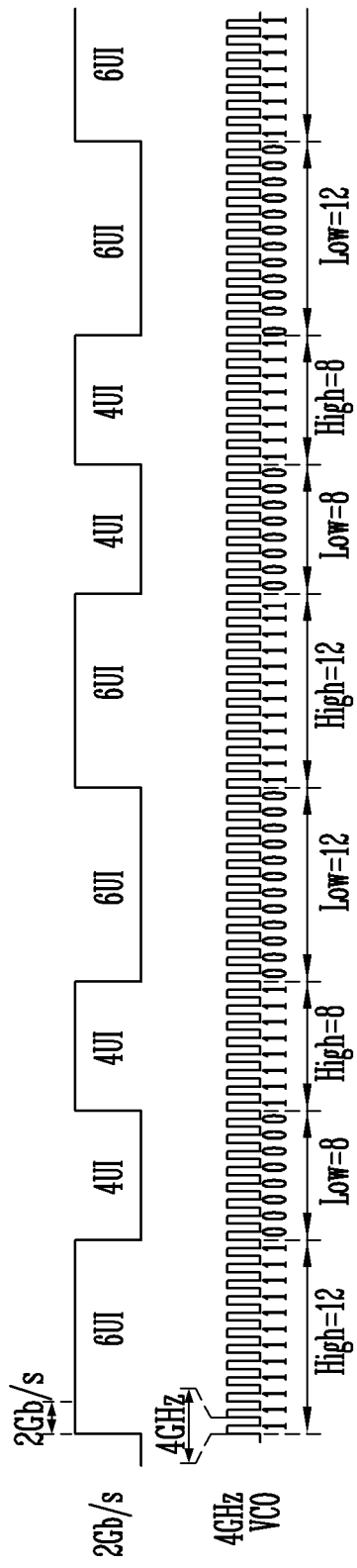

For example, referring to FIG. 12, the timing controller 11 may supply the clock training pattern CTP at 2 Gbps. The sampling signal repeats a high logic level of 12 UI, a low logic level of 8 UI, a high logic level of 8 UI, and a low logic level of 12 UI. The oscillator controller VCC may recognize that the data supply speed of the timing controller 11 corresponds to 2 Gbps, with reference to the values stored in the register REG, and turn on the third switch SW33 coupled to the third voltage control oscillator VCO3 having a frequency band exceeding 1 GHz and being 2 GHz or less.

Figure 13:
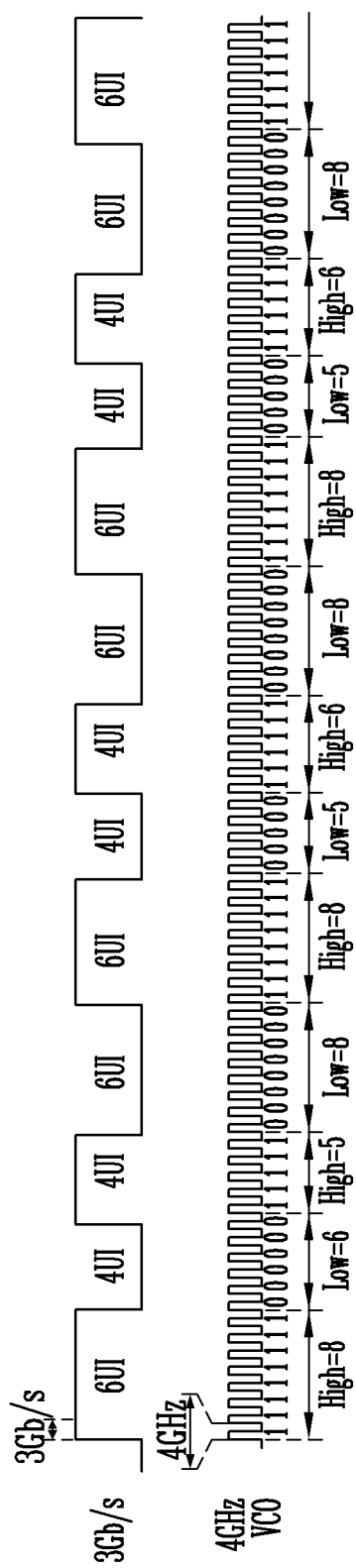

For example, referring to FIG. 13, the timing controller 11 may supply the clock training pattern CTP at 3 Gbps. The sampling signal repeats a high logic level of 8 UI, a low logic level of 6 (or 5) UI, a high logic level of 5 (or 6) UI, and a low logic level of 8 UI. The oscillator controller VCC may recognize that the data supply speed of the timing controller 11 corresponds to 3 Gbps, with reference to the values stored in the register REG, and turn on the third switch SW32 coupled to the second voltage control oscillator VCO2 having a frequency band exceeding 2 GHz and being 3 GHz or less.

Figure 14:
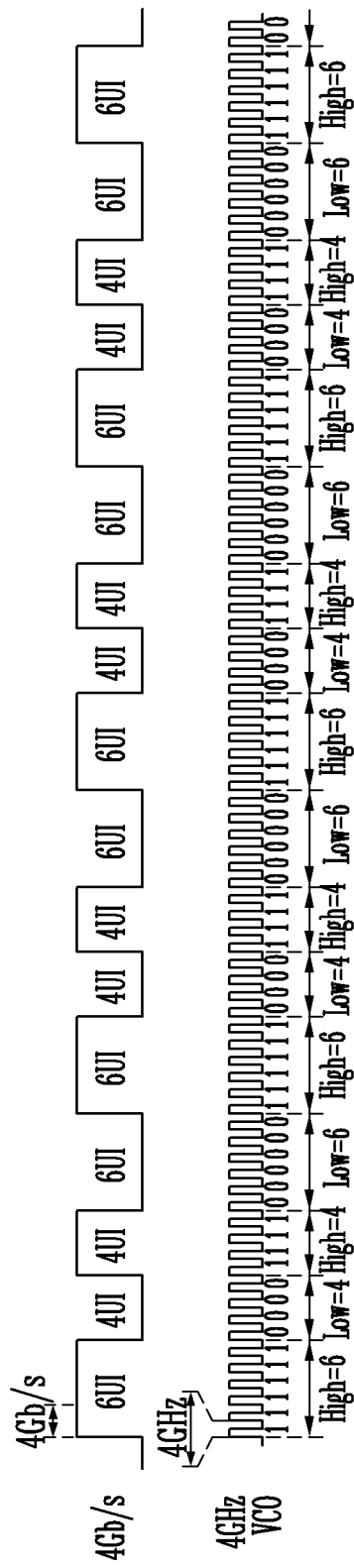

For example, referring to FIG. 14, the timing controller 11 may supply the clock training pattern CTP at 4 Gbps. The sampling signal repeats a high logic level of 6 UI, a low logic level of 4 UI, a high logic level of 4 UI, and a low logic level of 6 UI. The oscillator controller VCC may recognize that the data supply speed of the timing controller 11 corresponds to 4 Gbps, with reference to the values stored in the register REG, and turn on the third switch SW31 coupled to the first voltage control oscillator VCO1 having a frequency band exceeding 3 GHz and being 4 GHz or less.

When one of the third switches SW31, SW32, SW33, and SW34 is turned on, the oscillator controller VCC may switch the level of the enable signal EN to a high logic level. In accordance with an embodiment, the oscillator controller VCC turns on a selected third switch after the fourth switch SW4 is turned on, so that two or more voltage control oscillators can be prevented from being simultaneously coupled to the first node N1.

Figure 15:
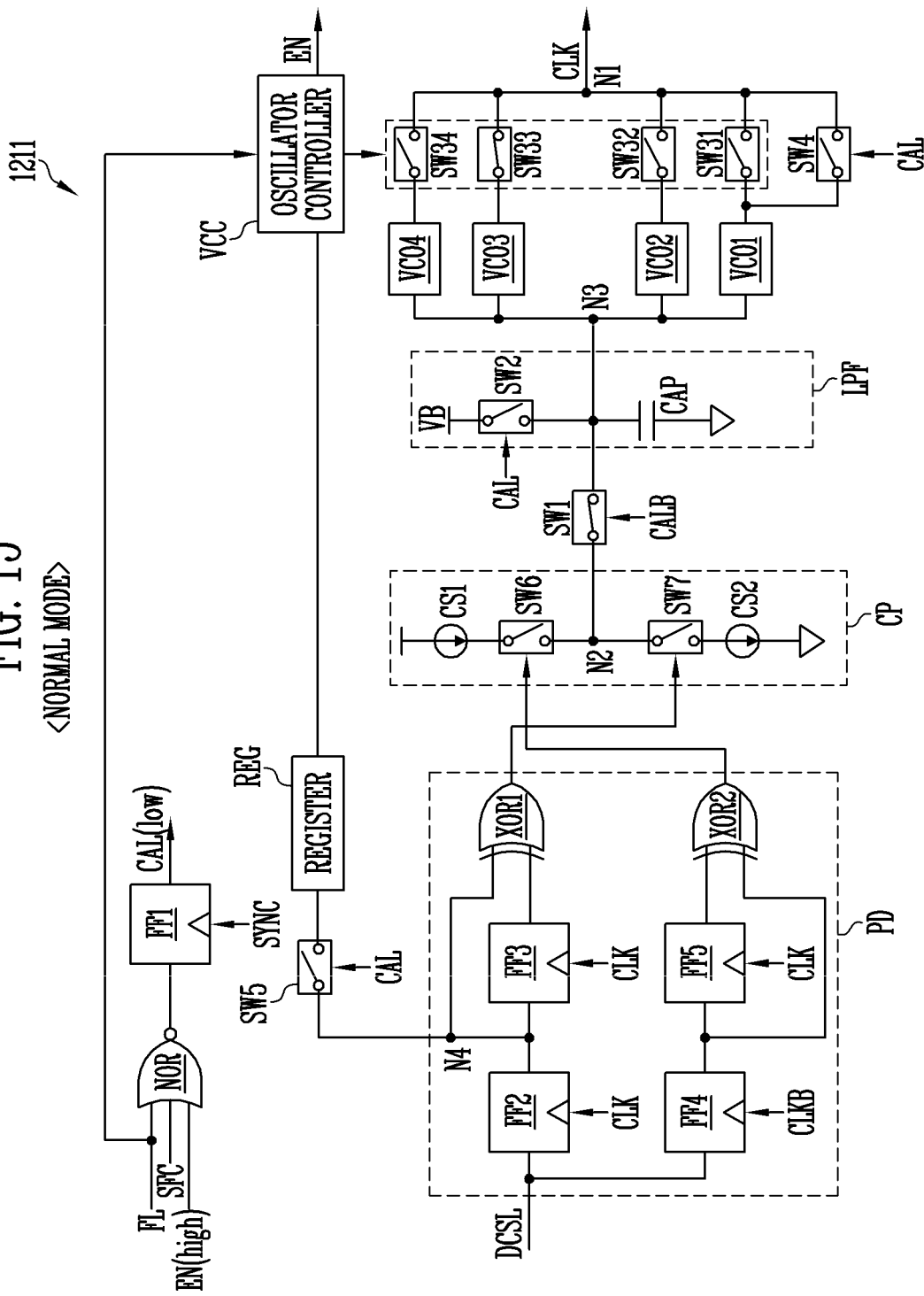
FIG. 15 is a diagram illustrating operation of the clock data recovery circuit shown in FIG. 9 in a normal mode in accordance with an embodiment.

FIG. 15 is a diagram illustrating operation of the clock data recovery circuit shown in FIG. 9 in the normal mode in accordance with an embodiment.

The third switch SW33 may be turned on such that the third voltage control oscillator VCO3 is selected, as illustrated in FIG. 15.

Since the level of the enable signal EN is switched to the high logic level, the calibration signal CAL of a low logic level may be output through the NOR gate NOR and the first flip-flop FF1. The inverted signal CALB has a high logic level.

When the calibration signal CAL of the low logic level is output, the second switch SW2, the fourth switch SW4, and the fifth switch SW5 may be turned off. The first switch SW1 may be turned on by the inverted signal CALB of the calibration signal CAL. Accordingly, the second node N2 and the third node N3 may be coupled to each other. Therefore, the third node N3 is influenced by operations of the phase detector PD and the charge pump CP.

Therefore, a lock operation of the clock signal CLK may be performed in the normal mode by the third voltage control oscillator VCO3 selected in the calibration mode. A frequency and a phase of the clock signal CLK output from the third voltage control oscillator VCO3 may follow those of the clock training pattern CTP through operations of the phase detector PD, the charge pump CP, and the loop filter LPF.

A time taken from a point of time when the clock data recovery circuit enters into the normal mode to a point of time when the frequency and phase of the clock signal CLK follow those of the clock training pattern CTP, i.e., a time taken until the level of the lock signal FL is switched from an unlock level to a lock level, may be referred to as a lock time.

In accordance with an embodiment, the lock operation of the clock signal CLK is performed using a voltage control oscillator having a frequency band suitable for a data supply speed of the timing controller 11 in the calibration mode, so that the lock time can be reduced. For example, a lock time required to follow a data supply speed of 1.1 Gbps by sequentially lowering the clock frequency of 4 GHz in the existing clock data recovery circuit having no calibration mode may be referred to as a first time. A time required to select the third voltage control oscillator VCO3 by performing the calibration mode in the clock data recovery circuit 1211 of this embodiment may be referred to as a second time. A lock time required for a clock frequency of 2 GHz from the third voltage control oscillator VCO3 of this embodiment in the normal mode to follow the data supply speed of 1.1 Gbps may be referred to as a third time.

When the storage space of the register REG is set to 50 UI, the second time may be about 20 ns. As the result of an experiment, the sum of the second time and the third time may equal to about ¼ of the first time.

Thus, in accordance with an embodiment, the lock time is reduced, so that the clock signal CLK of an appropriate frequency can be rapidly generated corresponding to various data supply speeds of the timing controller 11.

In an embodiment, the clock data recovery circuit 1211 may enter into the calibration mode even when the clock signal CLK is in the unlock state during image frame display. When the clock signal CLK is in the unlock state, the level of the lock signal FL may be switched from a lock level to an unlock level. The level of the enable signal EN may be switched to a low logic level. When the display device 10 enters into the vertical blank period VBPn, the level of the clock training signal may be switched to a low logic level. Therefore, the calibration signal CAL may be output through the NOR gate NOR and the first flip-flop FF1, and the calibration mode may be again performed during the vertical blank period VBPn.

Figure 16:
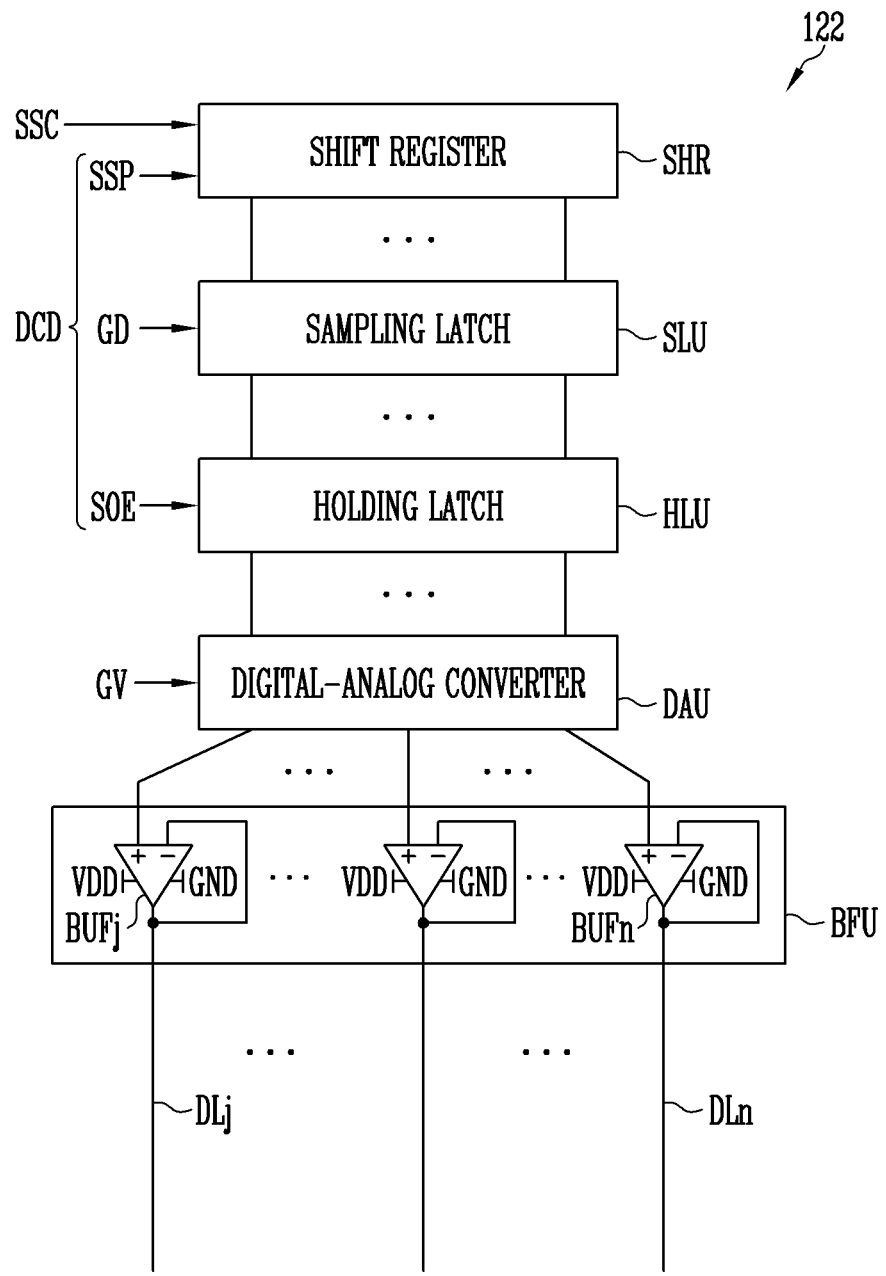
FIG. 16 is a diagram illustrating a data voltage generator in accordance with an embodiment.

FIG. 16 is a diagram illustrating a data voltage generator 122 in accordance with an embodiment.

Referring to FIG. 16, the data voltage generator 122 may include a shift register SHR, a sampling latch SLU, a holding latch HLU, a digital-analog converter DAU, and an output buffer BFU.

A data signal DCD received from the transceiver 121 may include a source start pulse SSP, grayscale values GD, a source output enable SOE, and the like.

The shift register SHR may sequentially generate sampling signals while shifting the source start pulse SSP for every period of the source shift clock SSC. A number of the sampling signals may correspond to that of data lines DLj to DLn. In an example, the number of the sampling signals may be equal to that of the data lines DLj to DLn. In an embodiment, when the display device 10 further includes a demultiplexer between the data driver 12 and the data lines DLj to DLn, the number of the sampling signals may be smaller than that of the data lines DLj to DLn. In an embodiment, the demultiplexer may not be implemented.

The sampling latch SLU may include sampling latch units of which the total number corresponds to that of the data lines DLj to DLn, and may sequentially receive grayscale values GD of an image frame from the timing controller 11. The sampling latch SLU may store the grayscale values GD sequentially received from the shift register SHR in corresponding sampling latch units, in response to the sampling signals sequentially supplied from the shift register SHR.

The holding latch HLU may include holding latch units of which the total number corresponds to that of the data lines DLj to DLn. The holding latch HLU may store, in the holding latch units, the grayscale values GD stored in the sampling latch units when the source output enable SOE is input.

The digital-analog converter DAU may include digital-analog conversion units of which the total number corresponds to that of the data lines DLj to DLn. For example, a number of the digital-analog conversion units may be equal to that to the data lines DLj to DLn. Each of the digital-analog conversion units may apply, to a corresponding data line, a grayscale voltage GV corresponding to a grayscale value GD stored in a corresponding holding latch unit.

The grayscale voltage GV may be provided from a grayscale voltage generator (not shown). The grayscale voltage generator may include a red grayscale voltage generator, a green grayscale voltage generator, and a blue grayscale voltage generator. The grayscale voltage GV may be set such that a luminance corresponding to each grayscale follows a gamma curve.

The output buffer BFU may include buffer units BUFj to BUFn. For example, each of the buffer units BUFj to BUFn may be an operational amplifier. Each of the buffer units BUFj to BUFn may be a voltage follower configured to apply an output of a corresponding digital-analog conversion unit to a corresponding data line. For example, an inverting terminal of each of the buffer units BUFj to BUFn may be coupled to an output terminal of the buffer unit, and a non-inverting terminal of the buffer unit may be coupled to an output terminal of a corresponding digital-analog conversion unit. Outputs of the buffer units BUFj to BUFn may be data voltages.

For example, an output terminal of a jth buffer unit BUFj may be coupled to a jth data line DLj, and may receive a buffer power voltage VDD and a ground power voltage GND. The buffer power voltage VDD may determine an upper limit of an output voltage (i.e., a data voltage) of the buffer unit BUFj. The ground power voltage GND may determine a lower limit of the output voltage of the buffer unit BUFj. The buffer unit BUFj may be further applied with one or more other voltages in addition to or instead of the buffer power voltage VDD and the ground power voltage GND, depending on a configuration of the buffer unit BUFj. The one or more other voltages may be control voltages for determining a slew rate of the buffer unit BUFj. The control voltages are different from the buffer power voltage VDD in that the control voltages are not voltages for determining the upper or lower limit of the output voltage of the buffer unit BUFj.

In accordance with embodiments, a clock signal having an appropriate frequency can be rapidly generated correspondingly to various data supply speeds.

Example embodiments have been disclosed. Although specific terms are employed, they are used and are to be interpreted in a generic and descriptive sense and not for purpose of limitation. Features, characteristics, and/or elements described in connection with a particular embodiment may be used singly or in combination with features, characteristics, and/or elements described in connection with other embodiments unless otherwise specifically indicated. Various changes may be made to the example embodiments without departing from the scope defined in the following claims.

What is claimed is:

1. A clock data recovery circuit comprising:
    a phase detector configured to output a phase adjustment signal based on a clock signal of a first node and an input signal;
    a charge pump electrically connected to the phase detector and configured to adjust a charge amount of a second node according to the phase adjustment signal received from the phase detector;
    a first switch electrically connected to the charge pump, a first terminal of the first switch being electrically connected to the second node and a second terminal of the first switch being electrically connected to a third node;
    a capacitor including a first electrode electrically connected to the third node; and
    voltage control oscillators each including a control terminal connected to the third node and an output terminal,
    wherein the first switch is configured to electrically connect the charge pump to the third node.

2. The clock data recovery circuit of claim 1, further comprising:
    a second switch, wherein a first terminal of the second switch is configured to receive a bias voltage and a second terminal of the second switch is electrically connected to the third node.

3. The clock data recovery circuit of claim 2, further comprising:
    third switches each configured to electrically connect output terminals of the voltage control oscillators to the first node.

4. The clock data recovery circuit of claim 3, wherein turn-on periods of the first switch do not overlap turn-on periods of the second switch, and
    wherein turn-on periods of a first one of the third switches do not overlap turn-on periods of a second one of the third switches.

5. The clock data recovery circuit of claim 3, wherein, when one of the third switches is on, the first switch is on and the second switch is off.

6. The clock data recovery circuit of claim 3, wherein, when all the third switches are off, at least two of the voltage control oscillators are electrically disconnected from the first node, the first switch is off, and the second switch is on.

7. The clock data recovery circuit of claim 3, further comprising:
    a fourth switch, wherein a first terminal of the fourth switch is electrically connected to an output terminal of a voltage control oscillator having a highest frequency band among the voltage control oscillators and a second terminal of the fourth switch is electrically connected to the first node.

8. The clock data recovery circuit of claim 7, wherein, when the fourth switch is on, the first switch is off and the second switch is on.

9. The clock data recovery circuit of claim 7, further comprising:
    a register; and
    a fifth switch, wherein a first terminal of the fifth switch is electrically connected to a fourth node, the fourth node is included in the phase detector, and a second terminal of the fifth switch is electrically connected to the register.

10. The clock data recovery circuit of claim 9, wherein, when the fifth switch is on, the first switch is off, the second switch is on, and the fourth switch is on.

11. The clock data recovery circuit of claim 9, further comprising an oscillator controller configured to turn on one of the third switches with reference to values stored in the register when allowing the others of the third switches to remain off.

12. The clock data recovery circuit of claim 11, further comprising:
    a NOR gate configured to receive a lock signal, a clock training signal, and an enable signal; and
    a first flip-flop, wherein an input terminal of the first flip-flop is configured to receive an output signal of the NOR gate, a control terminal of the first flip-flop is configured to receive a synchronization signal, and an output terminal of the first flip-flop is configured to output a control signal for the first switch, the second switch, the fourth switch, and the fifth switch.

13. The clock data recovery circuit of claim 12, wherein the synchronization signal is different from the clock signal.

14. The clock data recovery circuit of claim 12, wherein the oscillator controller is configured to switch a level of the enable signal when one of the third switches is turned on.

15. The clock data recovery circuit of claim 14, wherein the level of the enable signal is switched when a level of the lock signal is switched from a lock level to an unlock level.

16. The clock data recovery circuit of claim 15, wherein the oscillator controller is configured to turn off all the third switches when the level of the lock signal is switched from the lock level to the unlock level.

17. The clock data recovery circuit of claim 12, wherein the phase detector includes:
    a second flip-flop, wherein an input terminal of the second flip-flop is configured to receive the input signal, a control terminal of the second flip-flop is configured to receive the clock signal, and an output terminal of the second flip-flop is electrically connected to the fourth node;
    a third flip-flop, wherein an input terminal of the third flip-flop is electrically connected to the output terminal of the second flip-flop, and a control terminal of the third flip-flop is configured to receive the clock signal; and
    a first XOR gate, wherein a first input terminal of the first XOR gate is electrically connected to the fourth node, a second input terminal of the first XOR gate is electrically connected to an output terminal of the third flip-flop, and an output terminal of the first XOR gate is configured to output a first portion of the phase adjustment signal.

18. The clock data recovery circuit of claim 17, wherein the phase detector further includes:
    a fourth flip-flop, wherein an input terminal of the fourth flip-flop is configured to receive the input signal, and a control terminal of the fourth flip-flop is configured to receive an inverted clock signal;
    a fifth flip-flop, wherein an input terminal of the fifth flip-flop is electrically connected to an output terminal of the fourth flip-flop, and a control terminal of the fifth flip-flop is configured to receive the clock signal; and
    a second XOR gate, wherein a first input terminal of the second XOR gate is electrically connected to an output terminal of the fifth flip-flop, a second input terminal of the second XOR gate is electrically connected to the output terminal of the fourth flip-flop, and an output terminal of the second XOR gate is configured to output a second portion of the phase adjustment signal.

* * * * *